United States Patent [19]

Uchimura

[11] Patent Number: 4,678,540

[45] Date of Patent: Jul. 7, 1987

[54] PLASMA ETCH PROCESS

[75] Inventor: David H. Uchimura, Chandler, Ariz.

[73] Assignee: Tegal Corporation, Novato, Calif.

[21] Appl. No.: 872,073

[22] Filed: Jun. 9, 1986

[51] Int. Cl.$^4$ .............................................. B44C 1/22
[52] U.S. Cl. .................................. 156/643; 156/646; 156/659.1
[58] Field of Search ...................... 156/643, 646, 659.1, 156/655, 656, 665, 668, 904, 640; 252/79.1

[56] References Cited

U.S. PATENT DOCUMENTS

| | | | |
|---|---|---|---|
| 4,373,990 | 2/1983 | Porter | 156/643 |
| 4,484,979 | 11/1984 | Stocker | 156/643 |
| 4,487,652 | 12/1984 | Almgren | 156/643 |
| 4,522,681 | 6/1985 | Gorowitz et al. | 156/643 |
| 4,595,452 | 6/1986 | Landau et al. | 156/643 |

Primary Examiner—Kenneth M. Schor
Attorney, Agent, or Firm—Paul F. Wille

[57] ABSTRACT

In an aluminum etch process using $SiCl_4$ in a plasma reactor, edge profile is controlled by adding predetermined amounts of nitrogen and chlorine. The resulting aniosotropic etch causes walls to have a 60°–90° angle with respect to the substrate. Edge profile is further controlled by tapering the photoresist mask, e.g. by baking 6 Claims, 1 Drawing Figure

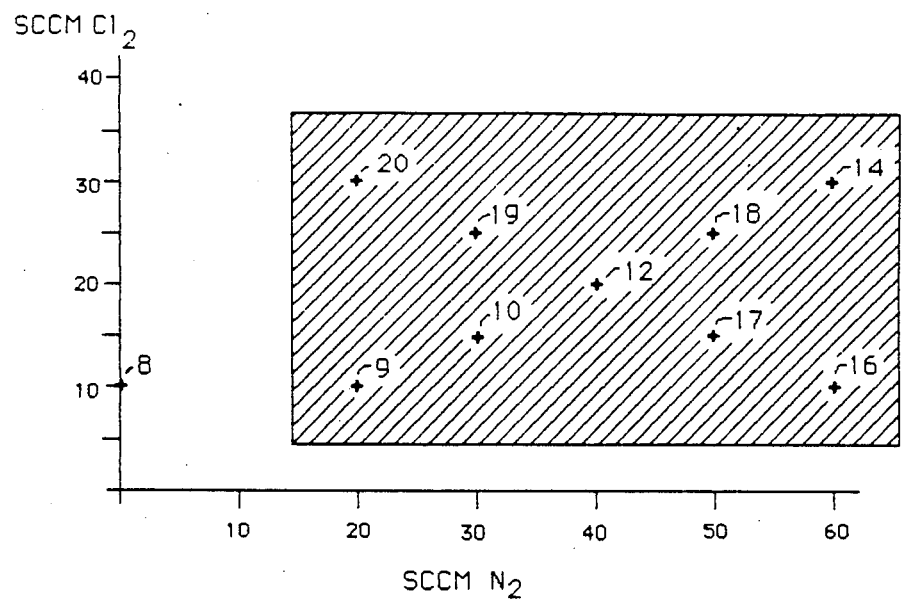

PLASMA ETCH PROCESS

BACKGROUND OF THE INVENTION

This invention relates to the fabrication of semiconductor devices and, in particular, to the formation of metal layers on semiconductor devices.

In manufacturing integrated circuits, one must provide conductive paths interconnecting various devices in the chip. These conductive paths may comprise a variety of metal or metal alloys such as tungsten silicide, polysilicon, or aluminum. In a typical process, a layer of aluminum is deposited and a layer of photoresist is deposited over the aluminum. The photoresist is patterned and then the aluminum is etched in a like pattern.

A problem occurs when it is time to form the next layer or layers over the conductive paths. The aluminum layer can be one micron (1000 nm.) thick, a considerable thickness relative to other layers. Further, the thickness is on the order of the smallest device geometry. Thus, one has what is known as a "step coverage" problem, e.g. forming a second conductive path at a right angle to the first and maintaining continuity over the step.

The problem of step coverage can also arise simply from the subsequent layer having a discontinuity at the outside corner of the step. To avoid this problem, various means have been employed to minimize the effect of the step. One way is simply to make the next layer so thick that discontinuities will not arise. This solution is frequently or even usually not available since layer thickness is determined by other parameters. An alternative is to doubly etch the aluminum layer, i.e. with and without photoresist. The problem with this alternative is that it adds several steps to the process flow and thins the conductive layer. Another alternative is to use an isotropic etch. In this case, uniformity becomes a problem since the undercutting of the photoresist tends to be erratic.

It is known in the prior art to etch aluminum in a plasma using carbon tetrachloride and chlorine, as shown in U.S. Pat. Nos. 4,182,646 and 4,341,593. It is also known, but not recommended, to etch aluminum in a plasma with silicon tetrachloride and nitrogen, as shown in U.S. Pat. No. 4,373,990. It is also known to erode a mask to obtain a tapered hole in the etched layer; e.g. for tapered holes in oxide see "Tegal Plasma Seminar Proceedings", (1983), pp 5–11 and 17–24.

In view of the foregoing, it is therefore an object of the present invention to provide an improved process for etching aluminum in a plasma.

Another object of the present invention is to provide a process for forming metal layers with controllable edge taper.

A further object of the present invention is to provide an improved plasma etch process using silicon tetrachloride.

SUMMARY OF THE INVENTION

In accordance with the present invention, an aluminum layer is etched in a parallel plate, plasma reactor using a mixture of silicon tetrachloride, nitrogen, and chlorine. By varying the proportions of the nitrogen and the chlorine, one can vary the taper of the sidewalls in the etched aluminum layer. The photoresist mask is baked after patterning to produce a tapered edge on the photoresist. The nitrogen is believed to control the rate at which the mask erodes, transferring its slope to the aluminum. The etch rate of the aluminum is also controlled, via the chlorine, relative to the mask. Thus the slope of the aluminum sidewalls can be equal to or greater than the slope of the photoresist sidewalls. In practice, aluminum sidewalls having a slope of from sixty-five to ninety degrees have been obtained.

A more complete understanding of the present invention can be obtained by considering the following detailed description in conjunction with the accompanying drawing, in which:

BRIEF DESCRIPTION OF THE DRAWINGS

The FIGURE illustrates a number of examples of the practice of the present invention.

DETAILED DESCRIPTION OF THE INVENTION

In accordance with the present invention, the slope of the sidewalls around the various apertures in a mask, e.g. photoresist, is transferred to an underlying material, e.g. aluminum, during a plasma etch process in which the mask also erodes. The gases chosen for the plasma etch process include secondary and tertiary gases which primarily etch one or the other of the mask and material. By controlling the proportion of the secondary and tertiary gases, one can control the slope of the sidewall being formed in the material, depending upon the slope of the sidewall in the mask.

In a preferred embodiment of the present invention, a 1.0 micron (1000 nm.) aluminum layer is deposited over a 1000 angstrom (100 nm.) silicon dioxide layer overlying a silicon wafer. A 1.1 micron (1100 nm.) layer of photoresist, e.g. AZ1470, as commercially available from Shipley, is deposited over the aluminum and patterned as is well-known in the art to form the desired pattern of the aluminum layer. Photoresist typically develops and etches with a relative straight, i.e. vertical, sidewall. In order to avoid transferring this ninety degree slope to the aluminum layer, the photoresist is baked to form a sloped edge about the various openings in the mask. As a particular example, but not intended to be construed as limiting, the particular photoresist involved was baked at 150° C. for 30 minutes. The resultant layer had a sidewall slope of approximately 60 degrees from the horizontal.

The wafer was then loaded into a plasma etch machine, e.g. a Model 1512 plasma reactor available from Tegal Corporation, and subjected to a plasma process in accordance with the following parameters. The primary gas comprised silicon tetrachloride flowing at a rate of 145 SCCM. The secondary gas comprised nitrogen flowing at a rate of 40 SCCM. The tertiary gas comprised chlorine flowing at a rate of 20 SCCM. The pressure within the reactor chamber was maintained at 120 millitorr (16 Pa) while two RF signals were applied to the reactor. The first comprised a signal at 13.56 MHz at a power of 300 watts, while the second comprised a 100 KHz signal at an applied power of 10 watts.

This process produced approximately a 70 degree slope with an etch rate of aluminum of 4000 angstroms (400 nm.) per minute. The appearance of the wafer under an electron microscope showed clean, uniform sidewalls having a slope of approximately 70 degrees. The horizontal surfaces of the wafer remained relatively smooth and clean.

The FIGURE illustrates the area in which the benefit of the present invention is obtained. Examples are noted with a plus sign. The example above corresponds to location 12 in the FIGURE. At location 9, for which the flow of nitrogen was 20 SCCM and the flow of chlorine was 10 SCCM, the process produced a slope of approximately 65 degrees at an etch rate of 1900 angstroms (190 nm.) per minute. At location 10, the slope was also 65 degrees at an etch rate of 3160 angstroms (316 nm.) per minute. At location 14, the etch rate of 5454 angstroms (545 nm.) per minute but the texturing of the sidewalls was excessive. At location 16, the etch rate of 2300 angstroms (230 nm.) per minute producing a slope of approximately 65 degrees. At location 17, the etch rate was 3000 angstroms (300 nm.) per minute producing a slope of approximately 70 degrees. At location 18, the etch rate was 4285 angstroms (429 nm.) per minutes, producing a slope of approximately 75 degrees. At location 19, the etch rate was 4440 angstroms (444 nm.) per minutes producing a slope of approximately 75 degrees. At location 20, the etch rate was 5454 angstroms (545 nm.) per minutes producing a slope of approximately 77 degrees. At location 8, the etch rate was ~6000 angstroms (~600 nm.) per minute producing a vertical sidewall.

There is thus provided by the present invention an improved etch process in which the mask layer is eroded during the etch cycle and the slope of the sidewall of the mask layer is approximately transferred to the underlying layer to be etch. The transfer is controllable however by controlling the ratio of the secondary and tertiary gases in the gas mixture.

Having thus described the invention it will be apparent to those of skill in the art that various modifications may be made within the spirit and scope of the present invention. For example, the same procedure applies to oxide masks as well as to other materials to be etched, such as silicon and polysilicon.

I claim:

1. In a process for etching aluminum material through a mask, and the mask erodes during the process, by contacting the aluminum material with a plasma formed in a first gaseous etchant, the improvement comprising the steps of:
    forming a sloping, non-vertical sidewall on the exposed edges of said mask; and then
    supplying a nitrogen, second gaseous etchant which reacts selectively with said mask; and simultaneously
    supplying a chlorine, third gaseous etchant which reacts selectively with said material; and
    controlling the proportion of said supplied second and third etchants to produce a predetermined transfer of slope from said mask to the sidewall formed in said material.

2. The process as set forth in claim 1 wherein said mask comprises a photoresist material.

3. The process as set forth in claim 2 wherein said forming step comprises heating said photoresist.

4. The process as set forth in claim 3 wherein said first gaseous etchant comprises $SiCl_4$, said second gaseous etchant comprises $N_2$, and said third gaseous etchant comprises $Cl_2$.

5. The process as set forth in claim 4 wherein the flow rates of said second and third etchants are in the ratio of from 6:1 to 2:3 respectively.

6. The process as set forth in claim 1 wherein the flow rates of said second and third etchants are in the ratio of from 6:1 to 2:3 respectively.

* * * * *